United States Patent [19]
Meyer et al.

[11] Patent Number: 5,617,028
[45] Date of Patent: Apr. 1, 1997

[54] MAGNETIC FIELD INHOMOGENEITY CORRECTION IN MRI USING ESTIMATED LINEAR MAGNETIC FIELD MAP

[75] Inventors: Craig H. Meyer, Palo Alto; Pablo Irarrazabal, Stanford, both of Calif.

[73] Assignee: Board of Trustees of the Leland Stanford Junior University, Stanford, Calif.

[21] Appl. No.: 401,591

[22] Filed: Mar. 9, 1995

[51] Int. Cl.⁶ .................................................. G01R 33/20
[52] U.S. Cl. ........................ 324/320; 324/309; 128/653.2
[58] Field of Search ...................... 324/318, 319, 324/320, 307, 309, 314; 128/653.2

[56] References Cited

U.S. PATENT DOCUMENTS

| | | | |
|---|---|---|---|
| 4,661,775 | 4/1987 | Kormos et al. | 324/307 |
| 4,720,679 | 1/1988 | Patrick et al. | 324/309 |
| 4,761,614 | 8/1988 | Prammer et al. | 324/320 |
| 4,797,615 | 1/1989 | Rotem et al. | 324/309 |
| 4,875,012 | 10/1989 | Maeda et al. | 324/304 |
| 5,157,330 | 10/1992 | Kaufman et al. | 324/320 |
| 5,233,992 | 8/1993 | Holt et al. | 324/321 |
| 5,343,151 | 8/1994 | Cory et al. | 324/320 |

OTHER PUBLICATIONS

Reese et al., Automated Shimming at 1.5T Using Echo–Planar . . . , Proc. of Soc. of Mag. Res. in Med., Aug. 14–20, 1993, p. 354.
Meyer et al., Fast Spiral Coronary Artery Imaging, Mag. Res. in Med., vol. 28, pp. 202–213, 1992.
Noll et al., Deblurring for Non–2D Fourier Transform Mag Res . . . Mag. Res. in Med., vol. 25, pp. 319–333, 1992.
Noll et al., Homogeneity Correction Method for Mag Res Imag . . . IEEE Trans. on Med. Img., vol. 10, No. 4, Dec. 1991, pp. 629–637.
Webb et al., Rapid, Fully Auto, Arbitrary–vol in vivo Shimming, Mag. Res. in Med., vol. 20, pp. 113–122, 1991.
Schneider et al., Rapid in vivo Proton Shimming, Mag. Res. in Med., vol. 18, pp. 335–347, 1991.
Maeda et al., Reducing Chem Shift Artifacts in MRI with Time . . . IEEE Trans. on Med. Img., vol. 8, No. 1, Mar. 1989, pp. 8–15.
Park et al., Fast Gradient–Echo Chem–Shifting Imaging, Mag. Res. in Med., vol. 7, pp. 340–345, 1988.
Maeda et al., Reconstruction by Weighted Correlation for MRI . . . IEEE Trans. on Med. Img., vol. 7, No. 1, Mar. 1988, pp. 26–31.
Yudilevich et al., Spiral Sampling in MRI—Effect of Inhomog . . . IEEE Trans. on Med. Img., vol. MI–6, No. 4, Dec. 1987, pp. 337–345.

*Primary Examiner*—Sandra L. O'Shea
*Assistant Examiner*—Raymond Y. Mah
*Attorney, Agent, or Firm*—Townsend and Townsend and Crew LLP; Henry K. Woodward

[57] ABSTRACT

A fast and robust method for correcting magnetic resonance image distortion due to field inhomogeneity is applied to spiral k-space scanning. The method includes acquiring a local field map, finding the best fit to a linear map, and using the linear field map to deblur the image distortions due to local frequency variations. The linear field map is determined using a maximum likelihood estimator with weights proportional to the pixel intensity. The method requires little additional computation and is robust in low signal regions and near abrupt field changes. The application of this method is illustrated in conjunction with a multi-slice, T2-weighted, breath-held spiral scan of the liver.

9 Claims, 4 Drawing Sheets

MAGNETIC FIELD INHOMOGENEITY CORRECTION IN MRI USING ESTIMATED LINEAR MAGNETIC FIELD MAP

The U.S. Government has rights in the disclosed invention pursuant to NIH Grants No. 1 ROI CA 50948 and No. 2 ROI HL 39297-06 to Leland Stanford Junior University.

BACKGROUND OF THE INVENTION

This invention relates generally to magnetic resonance imaging (MRI) and, more particularly, the invention relates to the correction of MRI distortion due to magnetic field inhomogeneity.

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

In obtaining magnetic resonance signals, a constant magnetic gradient can be employed as in 2-D Fourier Transform (2DFT) or Spin Warp imagery, or time varying magnetic gradients can be employed as in spiral k-space scanning. Inhomogeneity and chemical shift are significant challenges for any pulse sequence for MRI data acquisition. In 2DFT off resonance causes a local shift in the direction of the readout gradient, while in non-2DFT acquisitions (time-varying gradients), off-resonance causes local blurring. There are two important sources of inhomogeneity. The largest effect is due to the 3.4 ppm chemical shift between fat and water, which can be avoided by exciting only water, for example with a spectral-spatial pulse. The second effect is due to main-field inhomogeneity, which is typically on the order of 1 ppm. This effect is especially important for multi-slice sequences where off-center slices are difficult to shim. To minimize inhomogeneity artifacts Noll et al. proposed frequency and time segmented reconstruction algorithms, see U.S. Pat. No. 5,311,132. These algorithms include the acquisition of a field map and multiple reconstruction steps by a gridding procedure. Although this technique works well, it possesses two major drawbacks in that it is time consuming because of the multiple reconstruction steps and it fails in places where the field changes abruptly.

The present invention is directed to a fast and robust correction method that corrects only for the linear terms of an acquired field map.

SUMMARY OF THE INVENTION

The present invention corrects for magnetic resonance image distortion in an imaged volume due to magnetic field inhomogeneity by acquiring a local (to the imaged volume) magnetic field map, estimating a linear field map from the local field map, and then reconstructing MRI data based on the estimated linear field map.

In a preferred embodiment, the linear field map is determined using a maximum likelihood estimator with weights proportional to image pixel intensity. While this assumes that the actual field map deviates from the linear field map with a probability normally distributed and independent of position in order to facilitate ease in computation, the assumption in general is not true but is fairly benign in results. The method is robust in low signal regions and near abrupt field changes. In a k-space trajectory, the linear inhomogeneity terms are identical to a constant gradient in introducing a ramp to the actual k-space trajectory. In correcting for the ramp, data points are assigned to the skewed location in k-space based on the linear field map. Additionally, the linear field map can be used in combination with frequency-segmented or time-segmented methods to reduce the reconstruction time. The invention is applicable to two dimensional or three dimensional imaging.

The invention and objects and features thereof will be more readily apparent from the following detailed description and appended claims when taken with the drawing.

DESCRIPTION OF THE PREFERRED EMBODIMENT

Figure 1A:
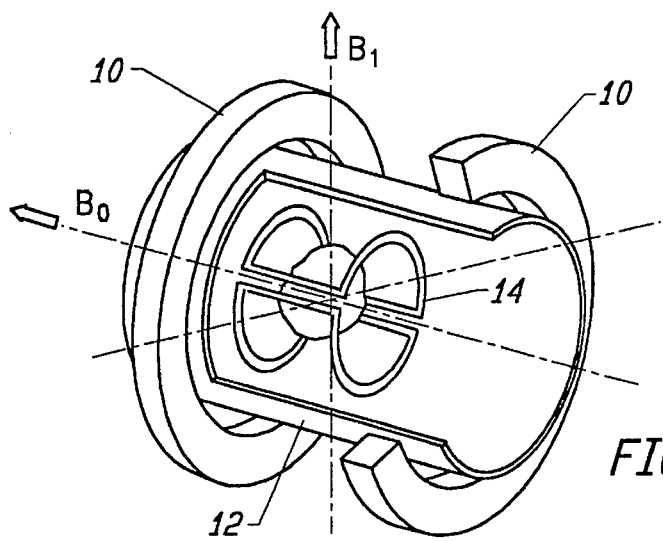
FIGS. 1A–1D illustrate the arrangement of conventional MRI apparatus and magnetic fields generated therein.
Figure 1B:
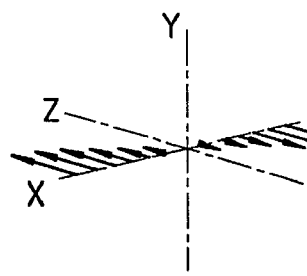
Figure 1C:
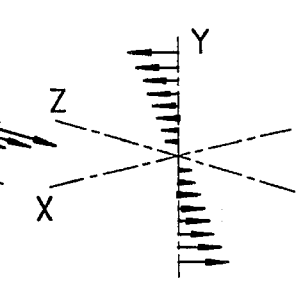
Figure 1D:
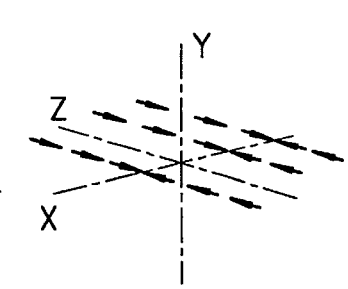

Referring now to the drawings, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," *Proceedings of the IEEE*, Vol. 71, No. 3, March 1983, pp. 338–350. Briefly, the uniform static field $B_0$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y and Z axes. FIGS. 1C and 1D are similar representations of the Y gradient and Z gradient fields, respectively.

Figure 2:
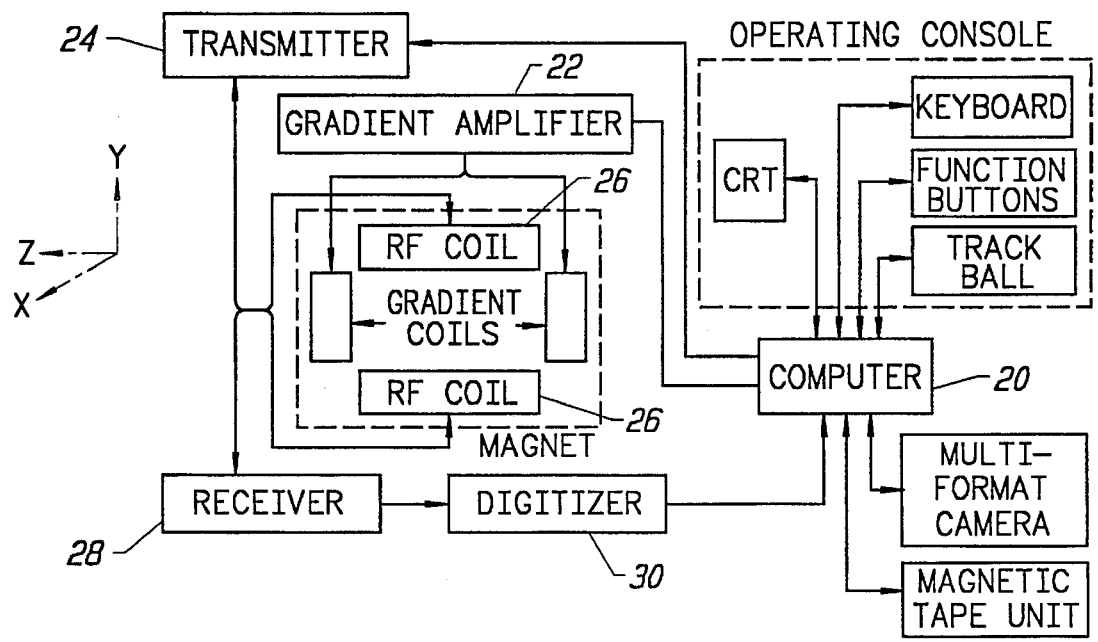
FIG. 2 is a functional block diagram of MRI imaging apparatus.

FIG. 2 is a functional block diagram of the imaging apparatus as disclosed in *NMR—A Perspective on Imaging*, General Electric Company. A computer 20 is programmed to control the operation of the NMR apparatus and process free induction decay (FID) signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

In accordance with the present invention, magnetic resonance image distortion due to magnetic field inhomogeneity is corrected by estimating a linear field map based on a measured local field map. A correction algorithm using the linear field map is readily implemented in reconstructing MRI data.

The inhomogeneity correction algorithm is comprised of two steps: estimation of a linear field map and reconstruction of the data using the linear estimation.

The local resonant frequency map f(x,y) in the presence of field inhomogeneity may be computed from two images acquired at different echo times. If the first image is $M_1(x,y) = m_1(x,y)e^{i\phi_1(x,y)}$ and the second image, acquired at an echo $\Delta t$ units of time later, is $M_2(x,y) = m_2(x,y)e^{i\phi_2(x,y)}$ then the field map is given by $$f(x,y) = \frac{\phi_2(x,y) - \phi_1(x,y)}{2\pi \Delta t} \quad (1)$$

which can also be computed as $$f(x,y) = \frac{\angle(M_1^*(x,y) M_2(x,y))}{2\pi \Delta t} \quad (2)$$

with $M_1^*(x,y)$ being the complex conjugate of $M_1(x,y)$. This last expression is computationally more robust to the angles wrapping around $2\pi$. Phase wraps of $2\pi$ in $2\pi\Delta t f(x,y)$ must be removed and/or $\Delta t$ chosen to minimize them. The field map can also be acquired using spin-echo based sequences.

A linear field map is fitted to the actual field map by means of the maximum likelihood estimator, such as disclosed in Reese et al., "Automated Shimming at 1.5T Using . Echo-Planar Image Frequency Maps, in *Twelfth Annual Scientific Meeting*, Society of Magnetic Resonance in Medicine, New York, 1993, p. 354. The fit assumes that the actual field map deviates from a linear field map with probability normally distributed and independent of the position. This assumption in general is not true; however, the effect of wrongly assuming it is fairly benign. If the linear map is $$\hat{f}(\theta;x,y) = f_0 + \alpha x + \beta Y \quad (3)$$

the parameter vector $\theta = [f_0 \alpha \beta]$ is found by solving $$\min_{\theta} X^n(\theta) = \sum_{i=1}^{N} \left| \frac{f(x_i,y_i) - \hat{f}(\theta;x_i,y_i)}{\sigma_i} \right|^n \quad (1)$$

where N is number of data points, $\sigma_i$ is the standard deviation of the difference for the position $(x_i,y_i)$, and n represents the norm in the minimization the term n equals 2 for the equation is a least squares minimization and the term n=1 for an absolute.

We will use the intensity of each pixel as the $\sigma_1$ weight. Since we expect more variability with longer echo times, we chose the magnitude of the second image, $$\sigma_i = \frac{1}{m(x,y)}.$$

The solution to Equation 4 is given by $$f_0 = \frac{\Delta_f}{\Delta} \quad (5)$$

$$\alpha = \frac{\Delta_x}{\Delta}$$

$$\beta = \frac{\Delta_y}{\Delta}$$

with $$\Delta = \begin{vmatrix} S & S_x & S_y \\ S_x & S_{xx} & S_{xy} \\ S_y & S_{xy} & S_{yy} \end{vmatrix} \quad (5a)$$

$$\Delta_f = \begin{vmatrix} S_f & S_x & S_y \\ S_{xf} & S_{xx} & S_{xy} \\ S_{yf} & S_{xy} & S_{yy} \end{vmatrix}$$

$$\Delta_x = \begin{vmatrix} S & S_f & S_y \\ S_x & S_{xf} & S_{xy} \\ S_y & S_{yf} & S_{yy} \end{vmatrix}$$

$$\Delta_y = \begin{vmatrix} S & S_x & S_f \\ S_x & S_{xx} & S_{xf} \\ S_y & S_{yx} & S_{yf} \end{vmatrix}$$

where $$S = \sum_{i=1}^{N} \frac{1}{\sigma_i^2} \quad (5b)$$

$$S_x = \sum_{i=1}^{N} \frac{X_i}{\sigma_i^2}$$

$$S_y = \sum_{i=1}^{N} \frac{Y_i}{\sigma_i^2}$$

$$S_f = \sum_{i=1}^{N} \frac{f(X_i,Y_i)}{\sigma_i^2}$$

$$S_{xx} = \sum_{i=1}^{N} \frac{X_i^2}{\sigma_i^2}$$

$$S_{yy} = \sum_{i=1}^{N} \frac{Y_i^2}{\sigma_i^2}$$

$$S_{xy} = \sum_{i=1}^{N} \frac{X_i Y_i}{\sigma_i^2}$$

$$S_{xf} = \sum_{i=1}^{N} \frac{X_i f(X_i,Y_i)}{\sigma_i^2}$$

$$S_{yf} = \sum_{i=1}^{N} \frac{Y_i f(X_i,Y_i)}{\sigma_i^2}$$

Correction for the linear terms in reconstruction requires little additional computation, since it only slightly modifies the k-space trajectory used in the gridding operation. Since linear inhomogeneity terms are identical to a constant gradient, they introduce a ramp to the actual k-space trajectory. The actual k-space trajectory "walks" in time along the direction of the inhomogeneity gradient. Artifacts are due to improper assignment of data in k space. To correct for this skew, we first estimate the linear field map and then simply assign each data point to the skewed location in k space. See Udilevich et al., "Spiral Sampling in Magnetic Resonance Imaging—The Effect of Inhomogeneities," *IEEE Transactions on Medical Imaging*, MI-6, 1987; Maeda et al., "Reconstruction by Weighted Correlation for MRI with Time-Varying Gradients," *IEEE Transactions on Medical Imaging*, 1988, 7, pp. 26–31. The gridding reconstruction proceeds as normal.

The acquired signal from an object m(x,y) in a field with local frequency deviations from the demodulation frequency, f(x,y), is $$s(t) = \iint m(x,y) e^{-i2\pi((k_x x + k_y y) + tf(x,y))} dX\, dY \quad (6)$$

where $k_x$ and $k_y$ are defined as the area under the readout gradients:

$$k_x = \frac{\gamma}{2\pi} \int G_x(\tau) d\tau \text{ and } k_y = \frac{\gamma}{2\pi} \int G_y(\tau) d\tau. \quad (6a)$$

The image, m(x,y) is difficult to reconstruct from Equation 6 for arbitrary trajectories in k-space $(k_x, k_y)$ and arbitrary field inhomogeneities, f(x,y). Considerable simplification is achieved if we use the linear approximation of Equation 3.

The model for the received signal from an object in the presence of linear field variation, as given by Equation 3 is $$S'(t) = \iint m(x,y) e^{-i2\pi((k_x + t\alpha)x + (k_y + t\beta)y + tf_0)} dx\, dy \quad (6b)$$

which can be expressed as $$S'(t) = e^{-i2\pi tf_0} \iint m(x,y) e^{-i2\pi(k_x' x + k_y' y)} dx\, dy \quad (7)$$

with $$k_x' = k_x + t\alpha \quad (7a)$$
$$k_y' = k_y + t\beta$$

According to the model, the data is constructed assuming that there is a linear field variation, which can be compensated by using the new trajectory $(k_x', k_y')$ and demodulating to a frequency of $f_0$ as in Equation 7.

Noll et al., "A Homogeneity Correction Method for Magnetic Resonance Imaging with Time-Varying Gradients," *IEEE Transactions on Medical Imaging*, 10, 629–637 (1991), assume that the inhomogeneity varies slowly and devise a segmentation approach in which each image segment is reconstructed with a gridding reconstruction and a homogeneous field. The final image is obtained by superimposing the segments. The segmentation can be done in the time dimension or in the frequency dimension. From now on we will refer only to the frequency-segmented method, although the discussion is equally valid for the time-segmented method.

For the correction method proposed in this paper we consider only the linear terms of the field inhomogeneity, $$\hat{f}(x, y) = f_0 + \alpha x + \beta y, \quad (8)$$

and the k-space trajectory is modified to reflect the actual k-space sampling position. The data is then reconstructed with the gridding algorithm.

A refinement of this basic correction method is to combine the linear correction with the frequency-segmented method. After the linear correction one can use the residual map, $$\Delta f(x,y) = f(x,y) - \hat{f}(x,y), \quad (9)$$

and apply the frequency-segmented reconstruction method. Potentially, it requires fewer segments with a faster reconstruction because it is expected that most local frequency variations are smaller in the residual map than in the original map.

For correcting either with the linear terms only or with both the linear terms and the frequency segmentation, a field map and a linear estimation are needed.

We have employed the inhomogeneity correction algorithm in conjunction with spiral scanning. The results shown here were acquired with a breath-held T2-weighted multi-slice spiral scan. Fourteen slices were acquired in 24 s. The excitation is a spectral-spatial pulse such that lipids are not excited. The readout for each slice is done with 12 interleaved spirals and received with a 4-receiver-channel phased array. The field of view is 36×36 cm and the resolution is 196×196 pixels. The slice thickness is 7 mm and the gap between slices is 3 mm.

To compute the field map we collected two single-shot spiral acquisitions with different echo times. These acquisitions occur during the approach to steady state so no scan time penalty is incurred. The field maps have a fairly limited resolution, 36×36 pixels, due to time constraints. The limited resolution is not a major problem because main-field inhomogeneity is mostly a slowly varying function.

Figure 3A:
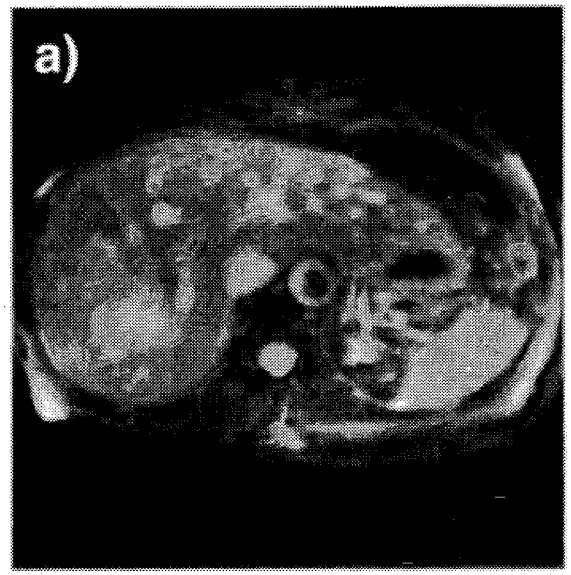
FIGS. 3A–3E illustrate T2-weighted breath-held spiral images through the abdomen of a patient with liver metastases with no inhomogeneity correction, demodulation to a center frequency, linear field map correction, frequency segmented algorithm correction, and reconstructed image with the frequency-segmented method with 21 frequency bins of 5 Hz each center on the median map frequency, respectively.
Figure 3B:
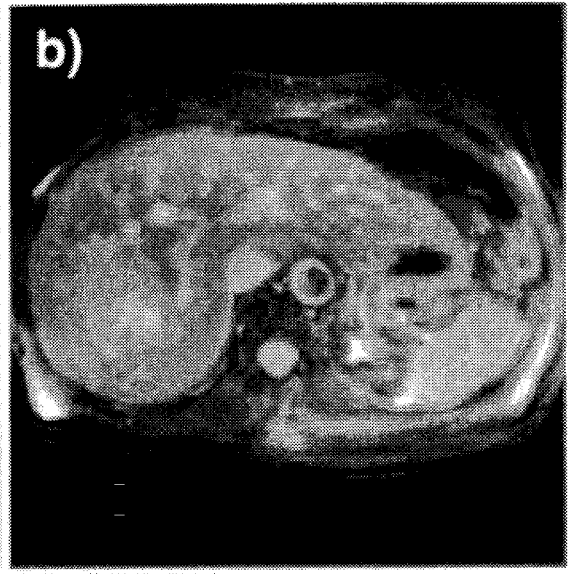
Figure 3C:
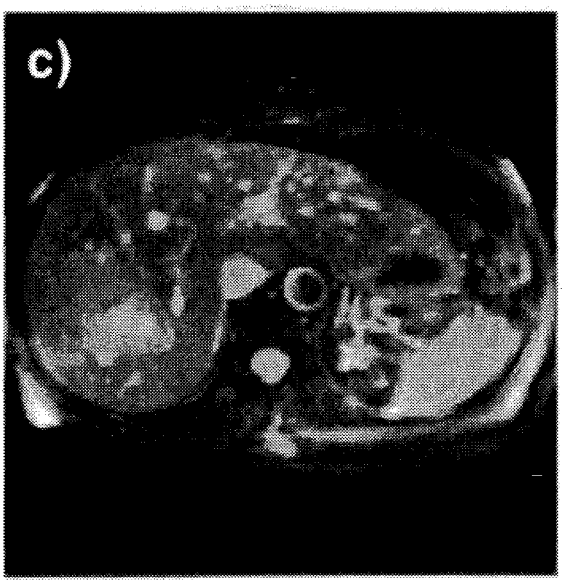
Figure 3D:
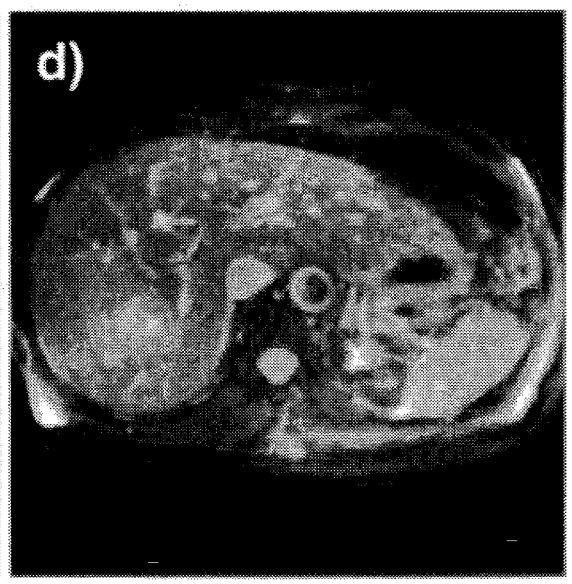
Figure 3E:
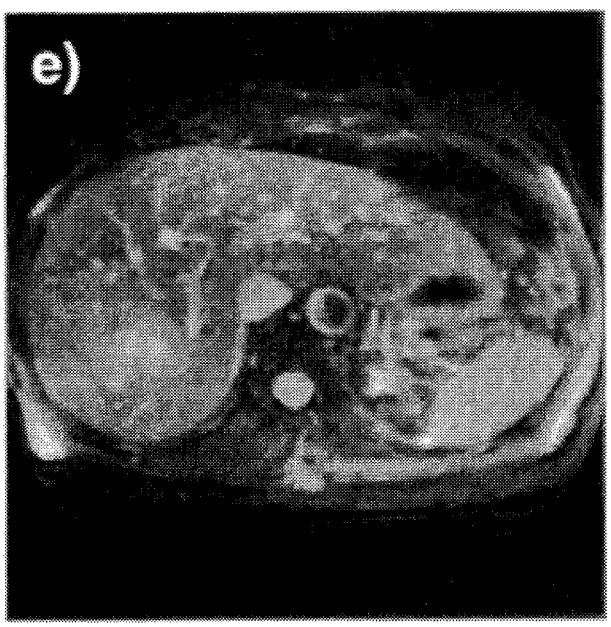

FIGS. 3A–3D show a slice through the abdomen of a patient with liver metastases for four different levels of deblurring. The images have been zoomed to show a region of 32×32 cm. FIG. 3A is the original data reconstructed with no inhomogeneity correction algorithm. FIG. 3B was reconstructed by demodulating at its center frequency ($f_0$ from Equation 7). FIG. 3C was reconstructed using the linear field map technique. In FIG. 3D the linear terms were corrected first, followed by a frequency-segmented reconstruction with 9 frequency bins of 5 Hz each and using the residual map. For comparison, FIG. 3E shows the image reconstructed with the frequency segmented method (21 frequency bins of 5 Hz each centered on the median map frequency). It is noted that the reconstruction of FIG. 3E took 20 times longer than the other reconstructions.

Figure 4:
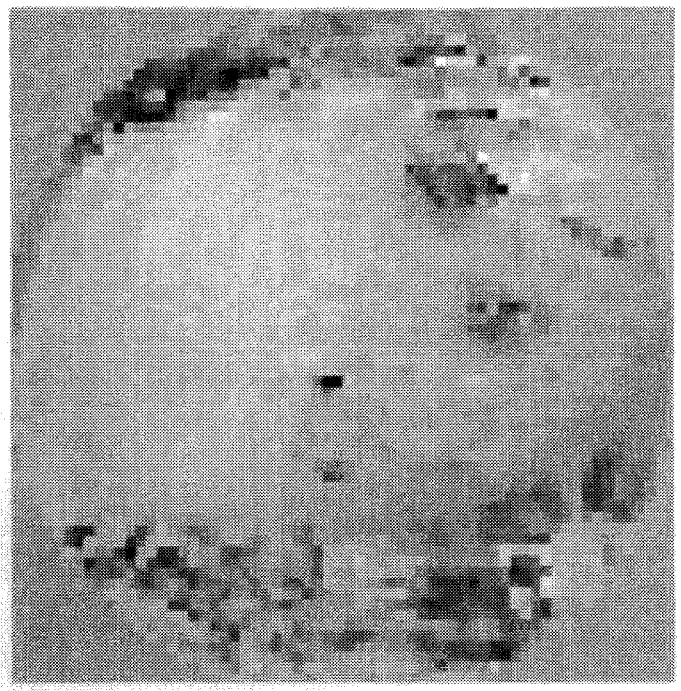
FIG. 4 is a field map corresponding to the slice imaged in FIG. 3.
Figure 5:
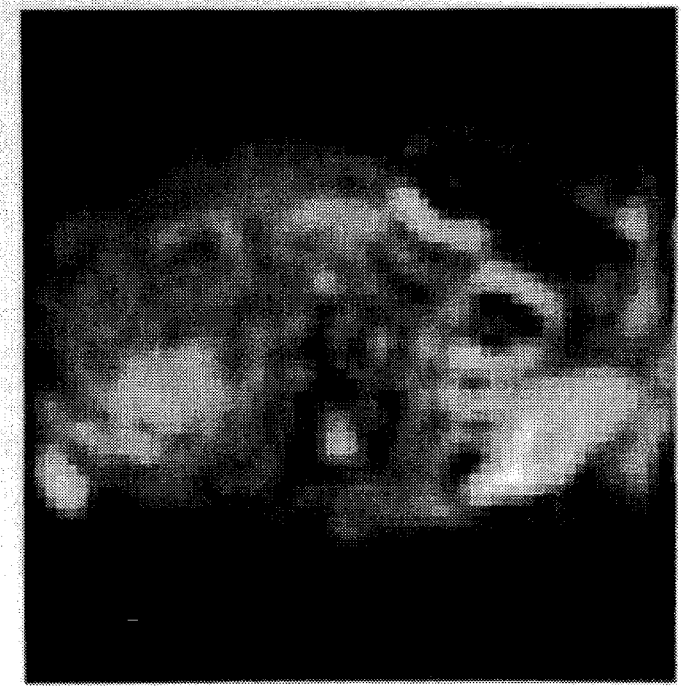
FIG. 5 is the weighting employed for the linear estimation that corresponds to the magnitude of the image used to compute the field map.

FIG. 4 shows the acquired field map from two single-spiral acquisitions, and FIG. 5 shows the weighting employed for the linear estimation that corresponds to the magnitude of the image used to complete the field map.

FIGS. 3B–3E show different levels of deblurring from the same original data shown in FIG. 3A. Demodulating to the center frequency yields an important image quality improvement, FIG. 3B. This is particularly true for off-center slices because the receiving frequency is tuned using the center slice. The improvement after applying the linear field map correction is noticeable in FIG. 3C. Observe the improved sharpness of blood vessels. Correcting with the combined method of linear field map and frequency segmentation, FIG. 3D or with the frequency segmented method alone, FIG. 3E result in similar quality images and both slightly better than the linear field map correction. The combined method is twice as fast as the frequency segmented alone. For simplicity of computation we used a squared norm in the minimization of Equation 4 to find the linear map. Other norms, for instance the absolute value, present different properties that may be advantageous for some applications, and therefore should also be investigated.

From FIG. 3 we can see that although the linear field map correction does not deblur the image as well as the frequency segmented method, it does produce a substantial improvement. Note the improved sharpness in the blood vessels. Thus, the linear field map correction is a good alternative to the frequency segmented deblurring algorithm, considering that it is considerably faster.

Since the field map values are weighted by the intensity of the image at the corresponding location, the estimation is robust to regions of low signal. In certain conditions this weighing scheme is not convenient. For instance, when using surface coils for the heart, the bright pixels of the chest wall will dominate the estimation and give an incorrect frequency for the region of interest. Different weighing schemes should be investigated.

For multi-slice data, we estimate a different linear map from the two dimensional (2D) field map in each slice. In some circumstances it would be convenient to estimate a three dimensional (3D) linear map from either multiple 2D field maps or a 3D field map. The latter approach is better suited to 3D acquisitions. It also makes relevant new issues such as registration between the field map acquisition and the image acquisition which is not a problem in 2D where the map and the image are acquired immediately one after the other.

Following is a-comparison of the computation times required by reconstructions with no inhomogeneity correction (T), frequency segmented correction ($T_f$) and linear field map correction ($T_1$). We will define Q as the time that takes to grid M non-uniform samples onto an N×N grid and q the time that takes to grid m non-uniform samples onto an n×n grid, where N×N is the size of the image and n×n is the size of the field map. The constants a,b,c and d will be relative weights of the different operations, and for simplicity we will assume square images and a single receiving coil.

No field map correction. Only a gridding reconstruction is done. The total time is T=Q.

Frequency segmented correction. The data is reconstructed B times (B is the number of frequency bins) with a gridding reconstruction algorithm and then recombined into one image (the recombination time is proportional to $BN^2$). To compute the field map, two gridding reconstructions are needed. Each one will grid m non-uniform samples onto a n×n grid, therefore the computation of the field map takes $2q+bn^2$, where $bn^2$ is the cost of computing Equation 1 (or Equation 2). The total time is $T_f=BQ+aBN^2+2q+bn^2$.

Linear field map correction. The proposed method requires: computation of the field map ($2q+bn^2$); estimation of the linear map (proportional to $n^2$); modification of the trajectories (proportional to M); and one gridding reconstruction step for the data (Q). The total time is $T_1=Q+2q+bn^2+cn^2+dM$.

The gridding reconstruction computational time Q, can be itemized in: the gridding step which is proportional to M; the Fourier transform step which is proportional to $N^2 \log N$; and the deconvolution step which is proportional to $N^2$. Therefore, $Q=\alpha M+\beta N^2 \log N+\gamma N^2+\delta$, with $\alpha,\beta,\gamma$ and $\delta$ being the relative weights of the operations in each step. To gain some insight from this formula we make some simplifications based on our experience. The deconvolution step is negligible and approximately half the time is spent taking the Fourier transform. That is $Q \approx M+N^2 \log N$. One interleaf is used for the field map acquisition and 12 for the data, M=12m, and also N=8n. With these approximation we have $Q \approx 90q$.

The recombination step ($aN^2$), computation of the field map ($bn^2$), estimation of the linear map ($cn^2$) and the modification of the trajectories (dM) are all negligible, also.

After these approximations we have

T=Q $T_f \approx (B+0.01)Q$ $T_1 \approx 1.01Q$

If we consider that B has to be at least 10, the computational load saving of the proposed method with respect to the frequency segmented method is clear. The saving by combining the linear and the frequency-segmented method depends on the reduction of B.

There is a fourth alternative that can be considered. It is an approximation to the frequency segmented method in which the modulation at each frequency bin is done after the gridding, such that the gridding is not repeated B times. This implementation would reduce the effective B from $T_f$ in approximately half.

The disclosed method for inhomogeneity correction using a linear field map is reliable, requires little extra computation time, and improves the image resolution considerably. It is especially useful in multi-slice scanning because of the difficulty of shimming large volumes while the invention has been described with reference to specific embodiments the description is illustrative of the invention and is not to be construed as limiting the invention. Various modifications and applications may occur to those skilled in the art without departing from the true spirit and scope of the invention as defined by the appended claims.

What is claimed is:

1. A method for correcting magnetic resonance image distortion in an imaged volume due to magnetic field inhomogeneity comprising the steps of a) acquiring a magnetic field map which is local in said imaged volume, b) estimating a linear magnetic field map based on said magnetic field map, c) obtaining magnetic resonance image data for said volume, and d) reconstructing said data based on said linear magnetic field map by assigning all data points to skewed locations in k-space based on said linear magnetic field map.

2. The method as defined by claim 1 wherein said linear field map is given by $$\hat{\theta}(\theta;x,y)=\theta_0+\alpha x+\beta y$$

and the parameter vector $\theta=[f_0 \alpha \beta]$ is found by solving $$\min_{\theta} X^n(\theta) = \sum_{i=1}^{N} \left| \frac{f(x_i,y_i) - \hat{f}(\theta;x_i,y_i)}{\sigma_i} \right|^n$$

where N is the number of data points, $\sigma_i$ is the standard deviation of the difference for a position $(x_i, Y_i)$, n defines the norm in the minimization.

3. The method as defined by claim 2 where n=2 for least squares minimization.

4. The method as defined by claim 2 where n=1 for an absolute.

5. The method as defined by claim 2 wherein step c) includes obtaining data having spiral k-space trajectories.

6. The method as defined by claim 5 wherein step a) includes collecting two single-shot spiral k-space acquisitions with different echo times.

7. The method as defined by claim 1 wherein linear deblurring is combined with segmented deblurring in obtaining an image.

8. The method as defined by claim 1 wherein said local magnetic field map is one slice through an object being imaged.

9. The method as defined by claim 8 wherein all steps are repeated for multiple slices through said object being imaged and three dimensional image data are reconstructed.

* * * * *